United States Patent [19]
Mourot et al.

[11] Patent Number: 5,511,014
[45] Date of Patent: Apr. 23, 1996

[54] METHOD FOR DETERMINING THE TRANSMITTANCE OF A FILTER CIRCUIT ADAPTED TO TRANSFORM THE IMPULSE RESPONSE OF A FILTER INTO A MINIMAL PHASE RESPONSE AND FILTER IMPLEMENTING THIS METHOD

[75] Inventors: Christophe Mourot, Asnieres; Armelle Wautier; Jean-Claude Dany, both of Gif-Sur-Yvette, all of France

[73] Assignee: Alcatel N.V., Amsterdam, Netherlands

[21] Appl. No.: 125,663

[22] Filed: Sep. 23, 1993

[30] Foreign Application Priority Data

Sep. 25, 1992 [FR] France .................................. 92 11467

[51] Int. Cl.⁶ .................................................. G06F 17/00
[52] U.S. Cl. .................... 364/724.01; 364/572; 333/167
[58] Field of Search ............................ 364/572, 724.01, 364/724.03, 725; 324/76.28, 76.29, 76.31, 76.44; 333/167

[56] References Cited

U.S. PATENT DOCUMENTS

4,310,721  1/1982  Manley et al. .................... 364/725 X

OTHER PUBLICATIONS

G. R. Reddy, "Design of Minimum–Phase FIR Digital Filter through Cepstrum", *Electronics Letters*, vol. 22, No. 23, Nov. 6, 1986, pp. 1225–1227.

S. Imai, "Digital Filter Design in the Quefrency Domain", *IEEE Transactions on Acoustics, Speech and Signal Processing*, vol. 26, No. 3, Jun. 1978 pp. 226–235.

*Primary Examiner*—Ellis B. Ramirez
*Assistant Examiner*—Edward Pipala
*Attorney, Agent, or Firm*—Sughrue, Mion, Zinn, Macpeak & Seas

[57] ABSTRACT

A method for determining the transmittance of a filter circuit adapted to transform the impulse response of a filter into a minimal phase response entails computing the theoretical frequency response of the filter circuit and the minimal phase frequency impulse response with a causality condition applied to the cepstrum of the minimal phase response, determining the theoretical transmittance as the inverse fast Fourier transform of the theoretical frequency response, estimating the transmittance of the filter circuit by truncation of the theoretical transmittance of which only a predetermined number of coefficients are retained and determining the minimal phase global response from a limited expansion of the cepstrum.

17 Claims, 2 Drawing Sheets

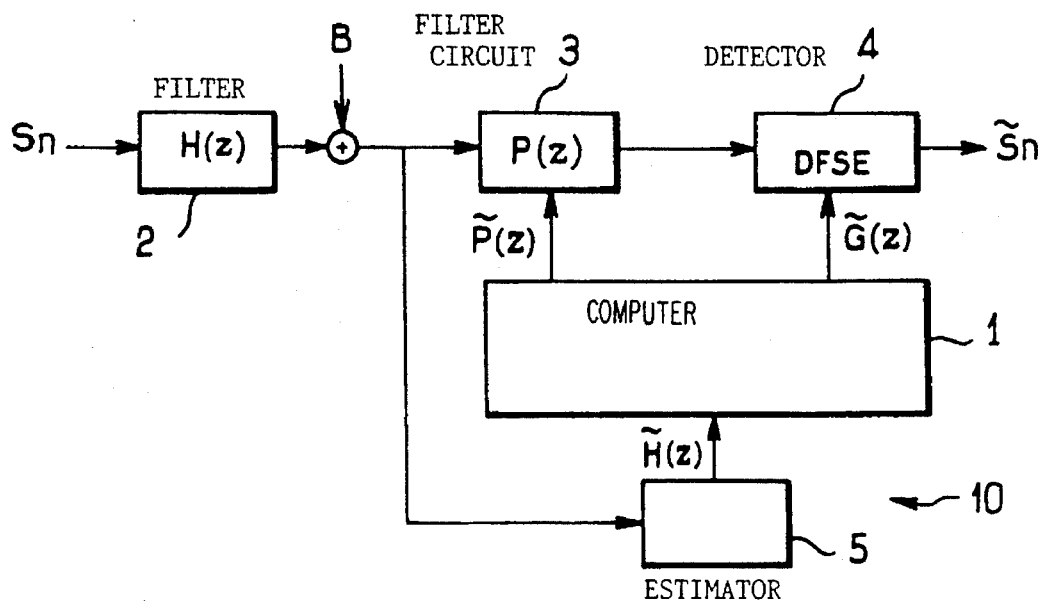
FIG_1
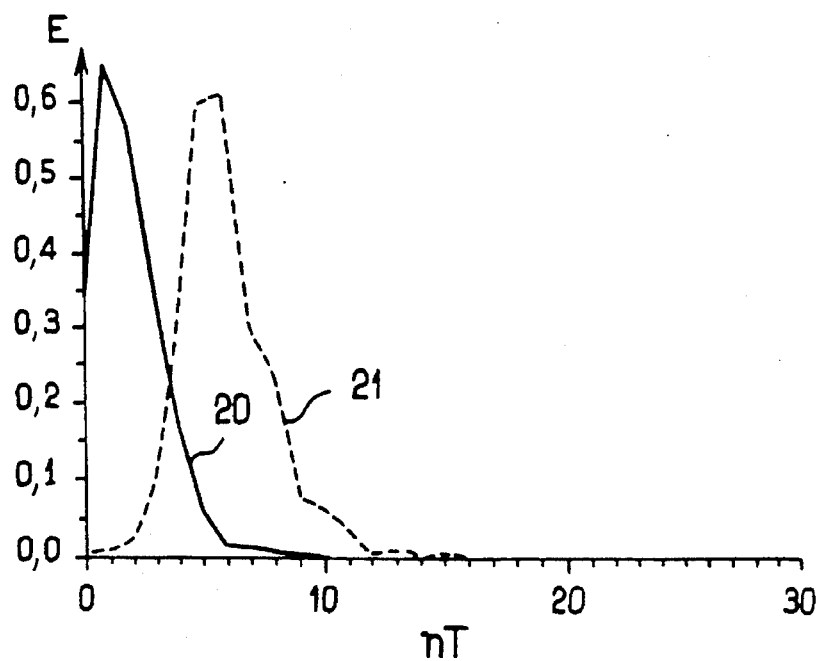
FIG_2

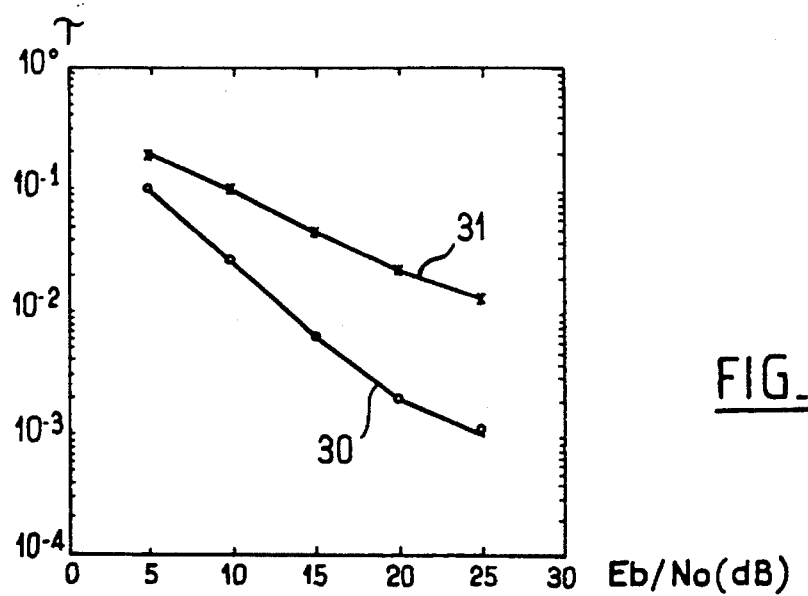
FIG_3
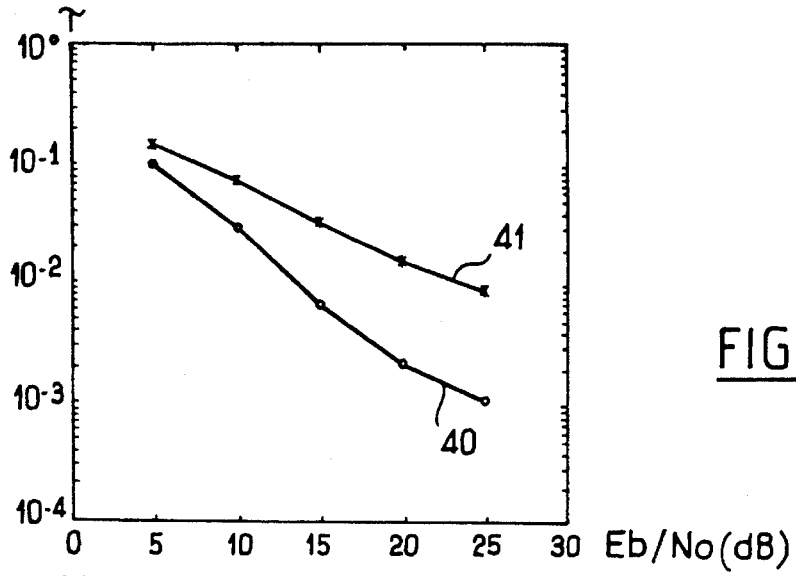
FIG_4
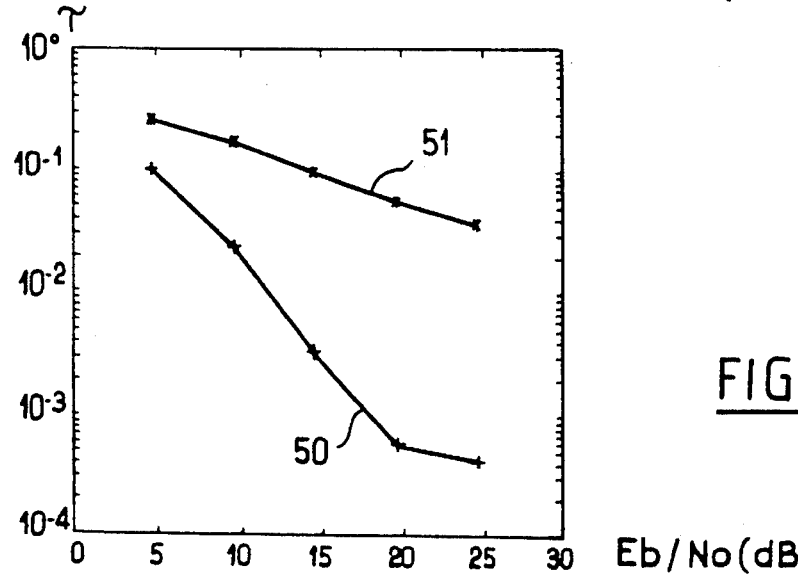
FIG_5

1

METHOD FOR DETERMINING THE TRANSMITTANCE OF A FILTER CIRCUIT ADAPTED TO TRANSFORM THE IMPULSE RESPONSE OF A FILTER INTO A MINIMAL PHASE RESPONSE AND FILTER IMPLEMENTING THIS METHOD

BACKGROUND OF THE INVENTION

1. Field of the Invention

The present invention concerns firstly a method for determining the transmittance of a filter circuit adapted to transform the impulse response of a filter into a minimal phase response and secondly a filter implementing this method.

2. Description of the Prior Art

A response is a minimal phase response if its z transform has zeros only within the unity circle in the complex plane.

In methods used until now there has been either a systematic search for all the zeros of the transfer function associated with the impulse response to be transformed followed by extraction of those whose modulus is greater than or equal to 1 or a search for only those zeros whose modulus is greater than or equal to 1 as disclosed in the article "Adaptive adjustment of receiver for distorted digital signals" IEE Proc. Part F (August 1984) Vol 131, pages 526 to 536.

These methods are of limited accuracy, however, and their complexity increases in proportion to the length of the filter. The number of operations to be performed is also a random variable and the convergence time varies.

An object of the invention is to remedy these problems by proposing a method for determining transmittance of a filter circuit associated with a filter having an impulse response $H(z)$, the filter circuit being designed so that the global impulse response $G(z)$ of the filter and the filter circuit is a minimal phase response, this method having a fixed convergence time and being of reduced complexity.

SUMMARY OF THE INVENTION

In one aspect the invention consists in a method for determining the transmittance $P(z)$ of a filter circuit associated with a filter having an impulse response $H(z)$ where said filter circuit is such that the global impulse response of said filter and said circuit is a minimal phase response, said method comprising the following steps:

determining the frequency response $H(f)$ of said filter as the Fourier transform of the impulse response $H(z)$ of said filter, determining the real part $a(f)$ of the cepstrum $\hat{H}(f)=-\ln(H(f))$ of the impulse response $H(f)$ of said filter to extract from said real part $a(f)$ an even part $p(f)$ and an odd part $q(f)$, determining the cepstrum $\hat{G}(f)=-\ln(G(f))$ of the global frequency response from said even part $p(f)$ and said odd part $q(f)$ of said cepstrum $\hat{H}(f)$ of the impulse response of said filter, determining the global frequency response $G(f)$ from said cepstrum $\hat{G}(f)$ of said response, determining the theoretical frequency response $C(f)$ of said filter circuit by means of the global frequency response $G(f)$ and the frequency response $H(f)$ of said filter, calculating the theoretical transmittance $C(z)$ of said filter circuit as the inverse Fourier transform of the frequency response $C(f)$ of said circuit, and determining the transmittance $P(z)$ of said filter circuit by truncating said transmittance $C(z)$ by retaining only a predetermined number of coefficients thereof.

The method in accordance with the invention can therefore concentrate the energy into the first samples of the impulse response at the output and transform the latter into a minimal phase response.

The method utilizes the cepstrum principle which is founded on the causality of the impulse response $\hat{G}(z)=-\ln(G(z))$ which ms obtained with a minimal phase impulse response $G(z)$.

In a preferred embodiment of the method in accordance with the invention the global impulse response $G(z)$ estimated from a limited expansion of the cepstrum $\hat{G}(z)$.

The method in accordance with the invention may further comprise the obtaining of a first estimate $\tilde{G}_O(z)$ of the minimal phase global response $G(z)$ comprising:

computing coefficients of said minimal phase impulse response $G(z)$ as the inverse discrete Fourier transform of said minimal phase frequency response $G(f)$, and retaining a predetermined number of significant coefficients to obtain said estimate $\tilde{G}_o(z)$.

In another aspect the invention consists in a phase corrector digital transversal filter adapted to transform a filter impulse response into a minimal phase response. Algorithm-based computation means are associated with the filter circuit to adapt its coefficients by application of a method in accordance with the invention.

Other features and advantages of the invention will emerge from the following description given by way of nonlimiting example with reference to the appended drawings.

BRIEF DESCRIPTION OF THE DRAWINGS

FIG. 1 is a block diagram of a receiver including a filter circuit in accordance with the invention.

FIG. 2 shows the variation as a function of time of the energy of the global impulse response of a filter and a filter circuit accordance with the invention.

FIGS. 3 through 5 show the improvement achieved with a filter circuit in accordance with the invention by showing the trend of the bit error rate at the output of a receiver as a function of the ratio of the mean energy per bit at the filter output to the unilateral power spectrum density of Gaussian additive white noise for the following channel configurations:

FIG. 3: channel with two equal power paths,

FIG. 4: channel with two unequal power paths,

FIG. 5: channel with three equal power paths.

DETAILED DESCRIPTION OF THE INVENTION

One example of implementation of a method in accordance with the invention will now be described with reference to a receiver.

The receiver 10 whose block diagram is shown in FIG. 1 is adapted to receive symbols Sn sent to the input of a filter 2, a transmission medium 2, for example, having an impulse response $H(z)$ sampled at a predetermined frequency $1/T$ where T is a sampling period. Noise B is added to these symbols during transmission. The receiver 10 comprises a filter circuit 3 adapted to transform the global impulse response into a minimal phase response on the input side of a decision feedback sequence estimator (DFSE) type detector 4 which generates receive symbols $\tilde{S}n$, means 5 for estimating the filter and calculating an estimate $\tilde{H}(z)$ of the impulse response of the filter, and algorithm-based computer 1 for adapting the coefficients of the filter circuit 3 which implements the method in accordance with the invention. The computer 1 generate firstly an estimate $\tilde{P}(z)$ of the transmittance $P(z)$ of the filter circuit 3 which is a finite impulse response digital transversal filter approximating an ideal phase correcting filter of infinite impulse response and secondly an estimate $\tilde{G}(z)$ of the minimal phase impulse response at the output of the filter circuit 3.

Notation:

$H(z)$ is the z transform of the impulse response of the filter sampled at the frequency $1/T$.

$G(z)$ is the z transform of the minimal phase global response.

$C(z)$ is the z transmittance of the filter circuit.

$$H(z) = \sum_{n=0}^{K} h_n z^{-n} \quad G(z) = \sum_{n=0}^{K} g_n z^{-n} \quad H(z)C(z) = G(z)$$

where K is the length of the filter.

Considering first the case where $H(z)$ has no zeros on the unity circle, p zeros inside this circle denoted $\alpha_i$, and q zeros outside it denoted $\beta_j$:

$$H(z) = h_0 \prod_{i=1}^{p} (1 - \alpha_i z^{-1}) \prod_{j=1}^{q} (1 - \beta_j z^{-1}) \quad |\alpha_i| < 1 |\beta_j| > 1 \, K = p + q \quad (1)$$

The minimal phase requirement in respect of $G(z)$ imposes the following expressions for $G(z)$ and $C(z)$:

$$G(z) = h_0 \prod_{j=1}^{q} \beta_j^* \prod_{i=1}^{p} (1 - \alpha_i z^{-1}) \prod_{j=1}^{q} \left(1 - \frac{1}{\beta_j^*} z^{-1}\right) \quad (2)$$

where the symbol * represents the conjugation operation.

The theoretical transmittance $C(z)$ of the unity gain all-pass filter circuit can be written:

$$C(z) = \frac{\prod_{j=1}^{q} (1 - \beta_j^* z)}{\prod_{j=1}^{q} \beta_j \prod_{j=1}^{q} \left(1 - \frac{1}{\beta_j} z\right)} \quad (3)$$

AS the poles of the transmittance $C(z)$ are outside the unity circle it is possible to expand $C(z)$ as follows:

$$C(z) = \frac{\prod_{j=1}^{q} (1 - \beta_j^* z)}{\prod_{j=1}^{q} \beta_j} \prod_{j=1}^{q} \left(1 + \frac{1}{\beta_j} z + \ldots + \frac{1}{\beta_j^n} z^n + \ldots \right) \quad (4)$$

which can be represented in the form of a series:

$$C(z) = \sum_{n=0}^{\infty} c_n z^n \quad (5)$$

The coefficients $C_n$ constitute a sequence which tends towards 0 as n tends towards infinity and $C(z)$ is the transmittance of a stable infinite impulse response anticausal ideal filter. Truncating the expansion of the transmittance $C(z)$ at a predetermined order L enables practical implementation using a finite length digital transversal filter. The transmittance of this filter may be expressed in the following polynomial form:

$$P(z) = c_0 + c_1 z + \ldots + c_L z^L \quad (6)$$

The response after passage through the filter of transmittance $P(z)$ is written:

$$H(z) \cdot P(z) = G(z) + \sum_{n=L+1-K}^{L} \epsilon_n z^n \quad \text{for } L \geq K \quad (7)$$

In fact:

$$H(z)P(z) = H(z)\left(C(z) - \sum_{n=L+1}^{\infty} c_n z^n\right)$$

$$= G(z) - H(z) \sum_{n=L+1}^{\infty} c_n z^n$$

The terms of $H(z)$ in $z^{-n}$ are null for $m>K$. The terms of $H(z)P(z)$ in $z^k$ are null for $k>L$. The second term of the second member of the previous equation can therefore be transformed as follows:

$$H(z) \cdot \sum_{n=L+1}^{+\infty} c_n z^n \Rightarrow \sum_{n=L+1-K}^{L} \epsilon_n z^n$$

For example, if $H(z) = h_o(1 - \beta z^{-1})$ the expression (7) can be written as follows:

$$H(z)P(z) = G(z) + h_0 \left(\frac{1}{\beta^{L+1}} - \frac{\beta^*}{\beta^L}\right) z^L \quad (8)$$

The truncation of the filter may be made less sharp by weighting it with a window.

If the impulse response $H(z)$ has zeros on the unity circle, these are not affected by the filter. The theoretical transmittance $C(z)$ as expressed by equation (3) remains the same but equations (1) and (2) become:

$$H(z) = h_0 \prod_{i=1}^{p} (1 - \alpha_i z^{-1}) \prod_{j=1}^{q} (1 - \beta_j z^{-1}) \prod_{i=1}^{r} (1 - \gamma_i z^{-1}) \quad (9)$$

$$|\alpha_i| < 1 \quad |\beta_j| > 1 \quad |\gamma_i| = 1 \quad K = p + q + r$$

and the minimal phase response is expressed as follows:

$$G(z) = \quad (10)$$

$$h_0 \prod_{j=1}^{q} \beta_j^* \prod_{i=1}^{p} (1 - \alpha_i z^{-1}) \prod_{j=1}^{q} \left(1 - \frac{1}{\beta_j^*} z^{-1}\right) \prod_{i=1}^{r} (1 - \gamma_i z^{-1})$$

The method in accordance with the invention uses the cepstrum method based on the fact that the impulse response of the filter with transmittance $\hat{G}(z) = -\ln(G(z))$ is causal when the filter of transmittance $G(z)$ is a minimal phase filter.

For $[z_{oi}] < 1$, we may write:

$$\ln(1 - z_{0i} z^{-1}) = -\sum_{n=1}^{\infty} \frac{1}{n} z_{0i}^n z^{-n}$$

From this we can deduce an expansion for the cepstrum $\hat{G}(z)$:

$$\hat{G}(z) = \ln g_0 - \sum_{i=1}^{p+q} \sum_{n=1}^{\infty} \frac{1}{n} z_{0i}^n z^{-n} \text{ with } G(z) = g_0 \sum_{j=1}^{p+q} (1 - z_{0j} z^{-1}) \quad (11)$$

$$\hat{G}(z) = \sum_{n=0}^{\infty} \hat{g}_0 z^{-n} \text{ with } \hat{g}_0 = \ln(g_0) \text{ and } \hat{g}_n = -\frac{1}{n} \sum_{j=1}^{p+q} z_{0i}^n \text{ for } n > 0 \quad (12)$$

Consider now the frequency response $H(f)$ of the filter. Assuming that the impulse response has no zeros on the unity circle, the modulus $[H(f)]$ cannot cancel out and the respective expressions for the frequency response $H(f)$ of the filter, the minimal phase frequency transmittance $G(f)$ and the frequency transmittance C(f) of the ideal filter circuit may be written:

$$H(f) = e^{-a(f)-j\phi(f)} \quad (13)$$

$$G(f) = e^{-a(f)-j\theta(f)} \quad (14)$$

$$C(f) = e^{j\phi(f)-j\theta(f)} = H^*(f) e^{a(f)-j\theta(f)} \quad (15)$$

The cepstrum $\hat{G}(f) = \ln(G(f)) = -a(f) - j\theta(f)$ is written:

$$\hat{G}(f) = \sum_{n=0}^{+\infty} \hat{g}_n e^{-j2\pi fnT}$$

$$= \sum_{n=0}^{+\infty} (\hat{g}_{1,n} \cos(2\pi fnT) + \hat{g}_{2,n} \sin(2\pi fnT) +$$

$$j \sum_{n=0}^{+\infty} \hat{g}_{1,n} \sin(2\pi fnT) - \hat{g}_{2,n} \cos(2\pi fnT)$$

where $\hat{g}_n = \hat{g}_{1,n} = 30 \; j\hat{g}_{2,n}$

It is possible to split a(f) into an even part p(f) and an odd part q(f) which can be expressed as follows:

$$p(f) = \frac{a(f) + a(-f)}{2} = -\sum_{n=0}^{\infty} \hat{g}_{1,n} \cos(2\pi fnT) \quad (16)$$

$$q(f) = \frac{a(f) - a(-f)}{2} = -\sum_{n=0}^{\infty} \hat{g}_{2,n} \sin(2\pi fnT) \quad (17)$$

The imaginary part $\theta(f)$ of the cepstrum can then be expressed as follows:

$$\theta(f) = -\sum_{n=0}^{\infty} (\hat{g}_{1,n} \sin(2\pi fnT) - \hat{g}_{2,n} \cos(2\pi fnT)) = \quad (18)$$

$$\sum_{n=0}^{\infty} T\sin(2\pi fnT) \int_{-\frac{1}{2T}}^{\frac{1}{2T}} p(v)\cos(2\pi v nT) dv -$$

$$\sum_{n=0}^{\infty} T\cos(2\pi fnT) \int_{-\frac{1}{2T}}^{\frac{1}{2T}} q(v)\sin(2\pi v nT) dv$$

From the phase $\theta(f)$ which depends only on the even and odd parts of a(f) it is possible to compute the frequency transmittance C(f) and the minimal phase response G(f).

The above mathematical analysis has been given merely to provide those elements necessary to understanding the operation of the algorithm for determining the coefficients of the filter circuit implementing the method in accordance with the invention. The practical use of this algorithm will now be explained.

If the filter impulse response H(z) has no zeros on the unity circle:

H(f) is a Fourier or fast Fourier transform of the impulse response H(z); this entails computing $N = 2^m$ samples and requires 2 mN multiplications and 3 mN additions.

Obtaining the quantities p(f) and q(f) requires 2N multiplications and 3N additions. $\{\hat{g}_n\}$ is a sequence which tends towards zero as n tends towards infinity; by limiting the expansion of $\hat{G}(z)$ to the order N/2 the coefficients $\hat{g}_{1,n}$ and $\hat{g}_{2,n}$ are respectively obtained by means of inverse cosine and sine transforms:

$$\text{For } n = 0, n = \frac{N}{2} \; \hat{g}_{1,n} = -\frac{1}{N} \left( \sum_{k=1}^{\frac{N}{2}-1} 2p\left(\frac{k}{NT}\right) \cos\left(2\pi \frac{nk}{N}\right) + p(0) + p\left(\frac{1}{2T}\right)(-1)^n \right)$$

$$\text{For } n \in [1, N/2-1] \; \hat{g}_{1,n} = -\frac{2}{N} \left( \sum_{k=1}^{\frac{N}{2}-1} 2p\left(\frac{k}{NT}\right) \cos\left(2\pi \frac{nk}{N}\right) + p(0) + p\left(\frac{1}{2T}\right)(-1)^n \right)$$

$$\text{For } n \in [1, N/2-1] \; \hat{g}_{2,n} = -\frac{2}{N} \left( \sum_{k=1}^{\frac{N}{2}-1} 2q\left(\frac{k}{NT}\right) \sin\left(2\pi \frac{nk}{N}\right) \right) \text{ and } \hat{g}_{2,\frac{N}{2}} = 0$$

Arbitrarily setting $\hat{g}_{2,0}$ to zero modifies expressions (2) and (3) for the minimal phase response G(z) and of the theoretical transmittance C(z), which become:

$$G(z) = |h_0| \prod_{j=1}^{q} (1 - \alpha_j z^{-1}) \prod_{j=1}^{q} \left(1 - \frac{1}{\beta_j^*} z^{-1}\right) \quad (19)$$

$$C(z) = \frac{h_0^* \prod_{j=1}^{q} (1 - \beta_j^* z)}{|h_0| \prod_{j=1}^{q} |\beta_j| \prod_{j=1}^{q} \left(1 - \frac{1}{\beta_j} z\right)} \quad (20)$$

These computations require b 4mN multiplications and 6mN additions.

The phase $\theta(f)$ is the imaginary part of the fast Fourier transform of the complex sequence $\hat{g}_n = \hat{g}_{1,n} + j + e_1 \text{cir} + e e_{2,n}$; computing it requires 2mN multiplications and 3mN additions.

The Fourier transform C(f) of the theoretical transmittance of the filter may be expressed in the following form:

$$C(f) = H^*(f) e^{a(f)} (\cos\theta(f) - j\sin\theta(f)) \quad (21)$$

Computing it requires 6N multiplications and 2N additions. The transmittance C(z) is the inverse fast Fourier transform and requires 2mN multiplications and 3mN additions. The estimated transmittance $\tilde{P}(z)$ of the filter circuit in accordance with the invention is obtained from the theoretical transmittance C(z) of which only the meaningful L+1 coefficients are retained.

In all, the algorithm uses:

10 mN+8N multiplications, 15 mN+4N additions of real numbers, and no division. This is a non-iterative algorithm and the number of operations is invariant and does not depend on the duration K of the impulse response to be transformed or on the order L at which the transmittance C(z) is truncated. However, the number N of samples must satisfy the condition:

$$N \geq L \geq K \quad (22)$$

If the impulse response H(z) of the filter has zeros on the unity circle it is no longer possible to use the cepstrum method but it is still possible to use the algorithm that has just been described subject to a heuristic modification in which the expression for a(f) is replaced with the following expression:

$$a(f) = -\tfrac{1}{2}\ln(H(f)H^*(f) + \epsilon) \quad (23)$$

in which ε must be chosen carefully to prevent the algorithm diverging (ε too small) or compromising the performance of the algorithm (8 too large). The minor modifications to the algorithm increase its complexity by only N additions of real numbers and N comparisons of real numbers.

The algorithm-based computation means 1 deliver an estimate $\tilde{G}(z)$ of the minimal phase response $\tilde{G}(z)$. This estimated response can take either of two forms:

A first form of the estimate $\tilde{G}_o(z)$ is obtained on retaining only the meaningful terms of the coefficients of the polynomial G(z) derived by the inverse discrete Fourier transform of the transform G(f) computed from a(f) and from θ(f). Computing this estimate requires 2mN+2N multiplications and 3mN additions.

A second form of the estimate $\tilde{G}_1(z)$ is made up of the causal part of the product $H(z)\tilde{P}(z)$ and requires 2(K+1)(K+2) multiplications and K(K+1) additions of real numbers.

In one example of application of a method in accordance with the invention to a telephone channel we have shown transfer of the energy E of the global impulse response of the channel and the filter circuit towards the time origin (see FIG. 2 in which the curves 20, 21 respectively represent the variation of the energy E as a function of the sampled time nT with the filter circuit in accordance with the invention respectively present and absent).

Use of a method in accordance with the invention in a complete receiver as shown in block diagram form in FIG. 1 has been simulated. A receiver of this kind can be used in time-division multiple access (TDMA) digital mobile communications. Messages are sent in the form of a succession of time slots at the centre of which is a learning sequence for estimating the response of the filter and adapting the coefficients of the filter circuit using a method in accordance with the invention.

To give a non-limiting example, consider quadrature amplitude modulation on the transmission channel 2, a six-symbol filter memory feeding the receiver 10 and a number of states processed by the modified Viterbi algorithm of the DFSE detector 4 equal to 16, corresponding to a memory for two symbols only. The time slot comprises 22 learning symbols and 144 data symbols.

The performance of the receiver 10 is assessed in terms of a bit error rate τ as a function of the ratio of the mean energy Eb per bit at the output of the channel 2 to the unilateral power spectrum density No of Gaussian additive white noise. Various channel profiles have been simulated:

a first channel c1 with two equal power paths separated by six time samples, a second channel c2 with two unequal power paths separated by six time samples, a third channel c3 with three equal power paths at respective times 0, 3Ts and 6Ts where Ts is the sampling period.

Referring to FIG. 3, which relates to the first channel c1, the curves 31 and 30 respectively represent the bit error rate τ as a function of the ratio Eb/No in a receiver which does not have any filter circuit in accordance with the invention (*) and in a receiver equipped with a filter circuit in accordance with the invention (o). Note that the error rate is systematically reduced with a filter circuit and that the improvement increases significantly with the mean energy.

In the case of the channel c2 with two unequal power paths shown in FIG. 4, the improvement in the bit error rate is still highly significant, the distance between the two curves 40, 41 being substantially less than for the channel c1.

In the case of the channel c3 with three equal power paths shown in FIG. 5, the distance between the bit error rate curves 50, 51 respectively with and without a filter circuit in accordance with the invention is particularly large, especially at higher levels of mean energy.

Of course, the invention is not limited to the examples just described and numerous modifications may be made to these examples without departing from the scope of the invention.

A method in accordance with the invention may be applied to any number of impulse responses. The number of zeros of the impulse response of a channel is no impediment to the application of this method, which is restricted, if at all, only by the high-speed computing capacity required to run the adaptation algorithm.

There is claimed:

1. In a receiver, connected to a filter medium transmitting first symbols and having an impulse response H(z), having a filter circuit providing a transmittance P(z) such that the filter circuit and the filter medium collectively possess a global impulse response characterized as a minimal phase impulse response G(z), serially connected to a detector for generating second symbols responsive to the first symbols and circuitry receiving an output of the filter medium and operatively connected to the filter circuit for generating coefficients corresponding to said transmittance P(z), a method for controlling said circuitry comprising the steps of:

(a) estimating a frequency response H(f) of the filter medium as a Fourier transform $\tilde{H}(z)$ of the impulse response H(z) of the filter medium;

(b) determining a real part a(f) of a cepstrum $\hat{H}(f) = -\ln(H)(f))$ of the frequency response H(f) of the filter medium to thereby extract from said real part of a(f) an even part p(f) and an odd part q(f);

(c) determining a cepstrum $\hat{G}(f) = -\ln(G(f))$ of a global frequency response G(f) from said even part p(f) and said odd part q(f) of said cepstrum $\hat{H}(f)$ of the impulse response H(z) of said filter medium;

(d) determining said global frequency response G(f) from said cepstrum $\hat{G}(f)$;

(e) determining a theoretical frequency response C(f) of the filter circuit responsive to said global frequency response G(f) and the frequency response H(f) of said filter medium;

(f) calculating a theoretical transmittance C(z) of the filter circuit as an inverse Fourier transform of said theoretical frequency response C(f) of the filter circuit;

(g) determining an estimated transmittance $\tilde{P}(z)$ of the filter circuit by truncating said transmittance C(z) thereby retaining only a predetermined number of coefficients thereof; and (h) providing said coefficients corresponding to said estimated transmittance $\tilde{P}(z)$ so as to operate the filter circuit.

2. The method according to claim 1, wherein said step (d) further comprises determining said global frequency response G(f) from a limited expansion of said cepstrum $\hat{G}(z)$.

3. The method according to claim 2, wherein a count of operations performed and a respective computation time associated with steps (a) through (g) are fixed and independent of an associated length of the filter medium and wherein said limited expansion and respective transforms each have a corresponding predetermined size.

4. The method according to claim 1, further comprising the step of:

(i) obtaining an estimated $\tilde{G}_o(z)$ of said minimal phase impulse response $G(z)$ by:
(1) computing coefficients of said minimal phase impulse response $G(z)$ as an inverse discrete Fourier transform of said minimal phase frequency response $G(f)$; and
(2) retaining a predetermined number of significant coefficients to obtain said estimated $\tilde{G}_o(z)$.

5. The method according to claim 1, further comprising the step of:

(j) obtaining an estimated $\tilde{G}_1(z)$ forming a casual part of a product of the filter impulse response $H(z)$ and said estimated transmittance $\tilde{P}(z)$ of the filter transmittance $P(z)$.

6. The method according to claim 1, wherein said step (b) comprises substeps comprising:

(1) determining said real part $a(f)$ of said cepstrum $\hat{H}(f)=-\ln(H(f)$ of the frequency response $H(f)$ of the filter medium to thereby extract from said real part of $a(f)$ said even part $p(f)$ and said odd part $q(f)$ when the impulse response $H(z)$ does not have respective zeros on said unity circle; and (2) heuristic processing to determine said real part $a(f)$ of the frequency response $H(f)$ of the filter medium to thereby extract from said real part of $a(f)$ said even part $p(f)$ and said odd part $q(f)$, when the impulse response $H(z)$ of the filter medium has said zeros on said unity circle, using $a(f)=-\frac{1}{2}\ln(H(f)H^*(f)+\epsilon)$
where $\epsilon$ represents an adjustment parameter.

7. In a receiver, connected to a filter medium transmitting first symbols and having an impulse response $H(z)$, having a filter circuit providing a transmittance $P(z)$, such that the filter circuit and the filter medium collectively possess a global impulse response characterized as a minimal phase response, serially connected to a detector for generating second symbols responsive to the first symbols, and a computer, connected to an estimator generating an estimate of a frequency response $\tilde{H}(f)$ of the filter medium as a Fourier transform $\tilde{H}(z)$ of the impulse response $H(z)$ of the filter medium, the computer being connected to the filter circuit for generating coefficients corresponding to an estimated transmittance $\tilde{H}(z)$, a method of operating said computer comprising the steps of:

(a) determining a real part $a(f)$ of a cepstrum $\hat{H}(f)=-\ln(H(f)$ of the frequency response $H(f)$ of the filter medium to thereby extract from said real part of $a(f)$ an even part $p(f)$ and an odd part $q(f)$;

(b) determining a cepstrum $\hat{G}(f)=-\ln(G(f))$ of a global frequency response $G(f)$ from said even part $p(f)$ and said odd part $q(f)$ of said cepstrum $\hat{H}(f)$ of the impulse response $H(z)$ of said filter medium;

(c) determining said global frequency response $G(f)$ from said cepstrum $\hat{G}(f)$;

(d) determining a theoretical frequency response $C(f)$ of the filter circuit responsive to said global frequency response $G(f)$ and the frequency response $H(f)$ of said filter medium;

(e) calculating a theoretical transmittance $C(z)$ of the filter circuit as an inverse Fourier transform of said theoretical frequency response $C(f)$ of the filter circuit;

(f) determining the estimated transmittance $\tilde{P}(z)$ of the filter circuit by truncating said theoretical transmittance $C(z)$ thereby retaining only a predetermined number of coefficients thereof; and (g) providing said coefficients corresponding to said estimated transmittance $\tilde{P}(z)$ so as to operate the filter circuit.

8. The method according to claim 7, wherein said step (c) further comprises determining said global frequency response $G(f)$ from a limited expansion of said cepstrum $\hat{G}(z)$.

9. The method according to claim 8, wherein a count of operations performed and a respective computation time associated with steps (a) through (f) are fixed and independent of an associated length of the filter medium and wherein said limited expansion and respective transforms each have a corresponding predetermined size.

10. The method according to claim 7, further comprising the step of:

(h) obtaining an estimated $\tilde{G}_o(z)$ of said minimal phase response $G(z)$ by:
(1) computing coefficients of said minimal phase impulse response $G(z)$ as an inverse discrete Fourier transform of said minimal phase frequency response $G(f)$; and
(2) retaining a predetermined number of significant coefficients to obtain said estimated $\tilde{G}_o(z)$.

11. The method according to claim 7, further comprising the step of:

(i) obtaining an estimated $\tilde{G}_1(z)$ forming a casual part of a product of the filter impulse response $H(z)$ and said estimated transmittance $\tilde{P}(z)$ of the filter transmittance $P(z)$.

12. The method according to claim 7, wherein said step (a) comprises substeps comprising:

(1) determining said real part $a(f)$ of said cepstrum $\hat{H}(f)=-\ln(H(f)$ of the frequency response $H(f)$ of the filter medium to thereby extract from said real part of $a(f)$ said even part $p(f)$ and said odd part $q(f)$ when the impulse response $H(z)$ does not have respective zeros on said unity circle; and (2) heuristic processing to determine said real part $a(f)$ of the frequency response $H(f)$ of the filter medium to thereby extract from said real part of $a(f)$ said even part $p(f)$ and said odd part $q(f)$, when the impulse response $H(z)$ of the filter medium has said zeros on said unity circle, using $a(f)=-\frac{1}{2}\ln(H(f)H^*(f)+\epsilon)$
where $\epsilon$ represents an adjustment parameter.

13. A filter circuit located in a receiver providing received symbols to a detector via said filter circuit and associated with a filter such that a global impulse response of said filter and said filter circuit represents a minimal phase response, said filter circuit comprising:

transversal filter means having a transmittance $P(z)$ for filtering said symbols;

estimating means for estimating a frequency response $H(f)$ of the filter as a Fourier transform $\tilde{H}(z)$ of the impulse response $H(z)$ of the filter; and algorithm-based computation means, operatively connected between said estimator means and said transversal filter means, for determining a real part $a(f)$ of a cepstrum $\hat{H}(f)=-\ln(H(f)$ of the frequency response $H(f)$ of the filter to thereby extract from said real part of $a(f)$ an even part $p(f)$ and an odd part $q(f)$, for determining a cepstrum $\hat{G}(f)=-\ln(G(f)$ of a global frequency response G(f) from said even part p(f) and said odd part q(f) of said cepstrum Ĥ(f) of the impulse response H(z) of said filter, for determining said global frequency response G(f) from said cepstrum Ĝ(f), for determining a theoretical frequency response C(f) of the transversal filter means responsive to said global frequency response G(f) and the frequency response H(f) of said filter, for calculating a theoretical transmittance C(z) of the transversal filter means as an inverse Fourier transform of said theoretical frequency response C(f) of the transversal filter means, for determining coefficients representing and estimated transmittance P̃(z) of the transversal filter means by truncating said theoretical transmittance C(z) thereby retaining only a predetermined number of respective transmittance coefficients, and for providing said number of said coefficients so as to operate said transversal filter means.

14. The filter circuit as recited in claim 13, wherein said transversal filter means comprises a finite impulse response digital transversal filter.

15. The filter circuit as recited in claim 13, wherein said algorithm-based computation means comprises means for determining said real part a(f) of said cepstrum Ĥ(f)=−ln(H(f)) of the frequency response H(f) of the filter to thereby extract from said real part of a(f) said even part p(f) and said odd part q(f) when the impulse response H(z) does not have respective zeros on said unity circle, for heuristic processing to determine said real part a(f) of the frequency response H(f) of the filter to thereby extract from said real part of a(f) said even part p(f) and said odd part q(f), when the impulse response H(z) of the filter has said zeros on said unity circle, using a(f)=−½ln(H(f)H*(f)+ε), where ε represents an adjustment parameter, for determining said cepstrum Ĝ(f)=−ln(G(f)) of said global frequency response G(f) from said even part p(f) and said odd part q(f) of said cepstrum Ĥ(f) of the impulse response H(z) of said filter, for determining said global frequency response G(f) from said cepstrum Ĝ(f), for determining said theoretical frequency response C(f) of said transversal filter means responsive to said global frequency response G(f) and the frequency response H(f) of said filter, for calculating said theoretical transmittance C(z) of the transversal filter means as said inverse Fourier transform of said theoretical frequency response C(f) of the transversal filter means, for determining coefficients representing said estimated transmittance P̃(z) of the transversal filter means by truncating said theoretical transmittance C(z) thereby retaining only said predetermined number of respective transmittance coefficients, and for providing said number of said coefficients to said transversal filter means.

16. A receiver to which transmitted symbols are applied via a filter medium having an impulse response H(z) and producing detected symbols, said receiver comprising:

transversal filter means receiving coefficients representing a transmittance P(z) for filtering said symbols, wherein said transversal filter means and the filter medium collectively provide a global impulse response G(z) representing a minimal phase response;

estimating means for estimating a frequency response H(f) of the filter medium as a Fourier transform H̃(z) of the impulse response H(z) of the filter medium;

algorithm-based computation means, operatively connected between said estimating means and said transversal filter means, for determining a real part a(f) of a cepstrum Ĥ(f)=− ln(H(f)) of the frequency response H(f) of the filter medium to thereby extract from said real part of a(f) an even part p(f) and an odd part q(f), for determining a cepstrum Ĝ(f)=−ln(G(f)) of a global frequency response G(f) from said even part p(f) and said odd part q(f) of said cepstrum Ĥ(f) of the impulse response H(z) of said filter medium, for determining said global frequency response G(f) from said cepstrum Ĝ(f), for determining a theoretical frequency response C(f) of said transversal filter means responsive to said global frequency response G(f) and the frequency response H(f) of said filter medium, for calculating a theoretical transmittance C(z) of said transversal filter means as an inverse Fourier transform of said theoretical frequency response C(f) of said transversal filter means for determining coefficients representing an estimated transmittance P̃(z) of the transversal filter means by truncating said theoretical transmittance C(z) thereby retaining only a predetermined number of respective transmittance coefficients, for providing said number of said coefficients so as to operate said transversal filter means, and for estimating an estimated minimal phase impulse response G̃(z) corresponding to an output of said transversal filter means; and detector means receiving filtered symbols for generating said detected symbols responsive to said estimated minimal phase impulse response G̃(z).

17. The receiver as recited in claim 16, wherein said algorithm-based computation means comprises means for determining said real part a(f) of said cepstrum Ĥ(f)=−ln(H(f)) of the frequency response H(f) of the filter medium to thereby extract from said real part of a(f) said even part p(f) and said odd part q(f) when the impulse response H(z) does not have respective zeros on said unity circle, for heuristic processing to determine said real part a(f) of the frequency response H(f) of the filter medium to thereby extract from said real part of a(f) said even part p(f) and said odd part q(f), when the impulse response H(z) of the filter medium has said zeros on said unity circle, using a(f)=−½ln(H(f)H*(f)+ε).wherein ε represents an adjustment parameter, for determining said global frequency response G(f) from said cepstrum Ĝ(f), for determining said theoretical frequency response C(f) of said transversal filter means responsive to said global frequency response G(f) and the frequency response H(f) of said filter medium, for calculating said theoretical transmittance C(z) of said transversal filter means as said inverse Fourier transform of said theoretical frequency response C(f) of said transversal filter means for determining coefficients representing said estimated transmittance P̃(z) of the transversal filter means by truncating said theoretical transmittance C(z) thereby retaining only said number of respective transmittance coefficients, for providing said number of said coefficients to said transversal filter means, and for generating said estimated minimal phase impulse response G̃(z) corresponding to said output of said transversal filter means.

* * * * *